(12) United States Patent
Carpenter et al.

(10) Patent No.: US 11,164,826 B2
(45) Date of Patent: Nov. 2, 2021

(54) PACKAGED INTEGRATED CIRCUIT HAVING STACKED DIE AND METHOD FOR MAKING

(71) Applicant: NXP USA, Inc., Austin, TX (US)

(72) Inventors: Burton Jesse Carpenter, Austin, TX (US); Fred T. Brauchler, Canton, MI (US)

(73) Assignee: NXP USA, Inc., Austin, TX (US)

( * ) Notice: Subject to any disclaimer, the term of this patent is extended or adjusted under 35 U.S.C. 154(b) by 84 days.

(21) Appl. No.: 16/557,825

(22) Filed: Aug. 30, 2019

(65) Prior Publication Data

US 2021/0066217 A1  Mar. 4, 2021

(51) Int. Cl.
| | |
|---|---|
| H01L 23/64 | (2006.01) |
| H01L 23/31 | (2006.01) |
| H01L 23/495 | (2006.01) |
| H02J 50/10 | (2016.01) |
| H01L 21/48 | (2006.01) |
| H01L 21/56 | (2006.01) |

(52) U.S. Cl.
CPC ........ *H01L 23/645* (2013.01); *H01L 21/4825* (2013.01); *H01L 21/565* (2013.01); *H01L 23/3107* (2013.01); *H01L 23/4952* (2013.01); *H01L 23/49513* (2013.01); *H01L 23/49575* (2013.01); *H02J 50/10* (2016.02)

(58) Field of Classification Search
CPC ... H01L 21/48; H01L 21/4803; H01L 21/481; H01L 21/4814; H01L 21/4825; H01L 21/50; H01L 21/56; H01L 21/565; H01L 23/28; H01L 23/3107; H01L 23/3114; H01L 23/3142; H01L 23/488; H01L 23/49513; H01L 23/4952; H01L 23/49531; H01L 23/49534; H01L 23/49575; H01L 23/49822; H01L 23/522; H01L 23/5227; H01L 23/64; H01L 23/645; H02J 50/10

See application file for complete search history.

(56) References Cited

U.S. PATENT DOCUMENTS

| | | | |
|---|---|---|---|
| 7,868,462 | B2 | 1/2011 | Choi et al. |
| 8,674,418 | B2 | 3/2014 | Poddar et al. |
| 9,035,422 | B2 | 5/2015 | Khanolkar et al. |
| 2009/0243782 | A1 | 10/2009 | Fouquet et al. |
| 2015/0001948 | A1 | 1/2015 | Brauchler et al. |
| 2019/0057942 | A1* | 2/2019 | Male ........... H01F 27/24 |
| 2019/0088576 | A1 | 3/2019 | Higgins et al. |

OTHER PUBLICATIONS

Ragonese et al.: "A Fully Integrated Galvanically Isolated DC-DC Converter With Data Communication", IEEE Transactions on Circuits and Systems-I: Regular Papers, vol. 65, No. 4, Apr. 2018, pp. 1432-1441.

* cited by examiner

*Primary Examiner* — Cheung Lee

(57) ABSTRACT

A packaged integrated circuit (IC) device includes a first IC die, a first layer of adhesive on a first major surface of the first IC die, and an isolation layer over the first layer of adhesive. The isolation layer has a first major surface and a second major surface, and the second major surface of the isolation layer is between the first layer of adhesive and the first major surface. The packaged IC device also includes a first inductor coil on the first major surface of the isolation layer, a second layer of adhesive on the isolation layer, and a second IC die on the second layer of adhesive.

14 Claims, 9 Drawing Sheets

PACKAGED INTEGRATED CIRCUIT HAVING STACKED DIE AND METHOD FOR MAKING

BACKGROUND

Field

This disclosure relates generally to integrated circuit packaging, and more specifically, to a packaged integrated circuit having stacked die.

Related Art

Communication between integrated circuit (IC) die can be achieved using Galvanically Isolated Communication Link (GICL) technology in which inductive coupling allows two die to communicate by way of transmitting and receiving inductors located in each of the die. In such applications, electrical (or galvanic) isolation is desired between the die. "Galvanic isolation" means that there is no metallic or DC electrically conductive path between the distinct circuits. For example, galvanic isolation may be desired to protect a first IC die that operates at a relatively low supply voltage from a second IC die that operates at a relatively high supply voltage difference from the first IC die. To provide galvanic isolation between the stacked die, an isolation layer can be used which extends beyond the edges of the top die. However, the isolation layer increases the distance between the coils within the die.

While GICL technology can communicate signals efficiently, even with the presence of an isolation layer between the die, it cannot transfer power efficiently. Coils in each of the stacked die used for GICL have too much loss and the coil-to-coil coupling between the stacked die is too low to allow for efficient power transfer, rending any power transfer practically unusable. Therefore, a need exists for creating a Galvanically Isolated Power Link (GIPL) to efficiently transfer power between die.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a packaged integrated circuit (IC) is formed having stacked IC die and an isolation layer between the stacked die, in which the isolation layer provides galvanic isolation between the stacked die. The isolation layer is a preformed isolation layer which also includes at least one coil which is used to provide a GIPL for transferring power between the stacked die. This prevents the need for including an inductive coil in both the top and bottom die of the stacked die. In one embodiment, the preformed isolation layer includes a coil on the top major surface of the isolation layer and a coil on the bottom major surface of the isolation layer configured to transfer power. This embodiment may allow for none of the stacked die to include inductive coils for communicating signals or power. In alternate embodiments, at least one coil located on the top or bottom major surface of the isolation layer may allow for improved power transfer efficiency with another coil in either the bottom or the top die. Also, a coil included on the preformed isolation layer may be sized and positioned to also serve as a corona shield.

Figure 1:
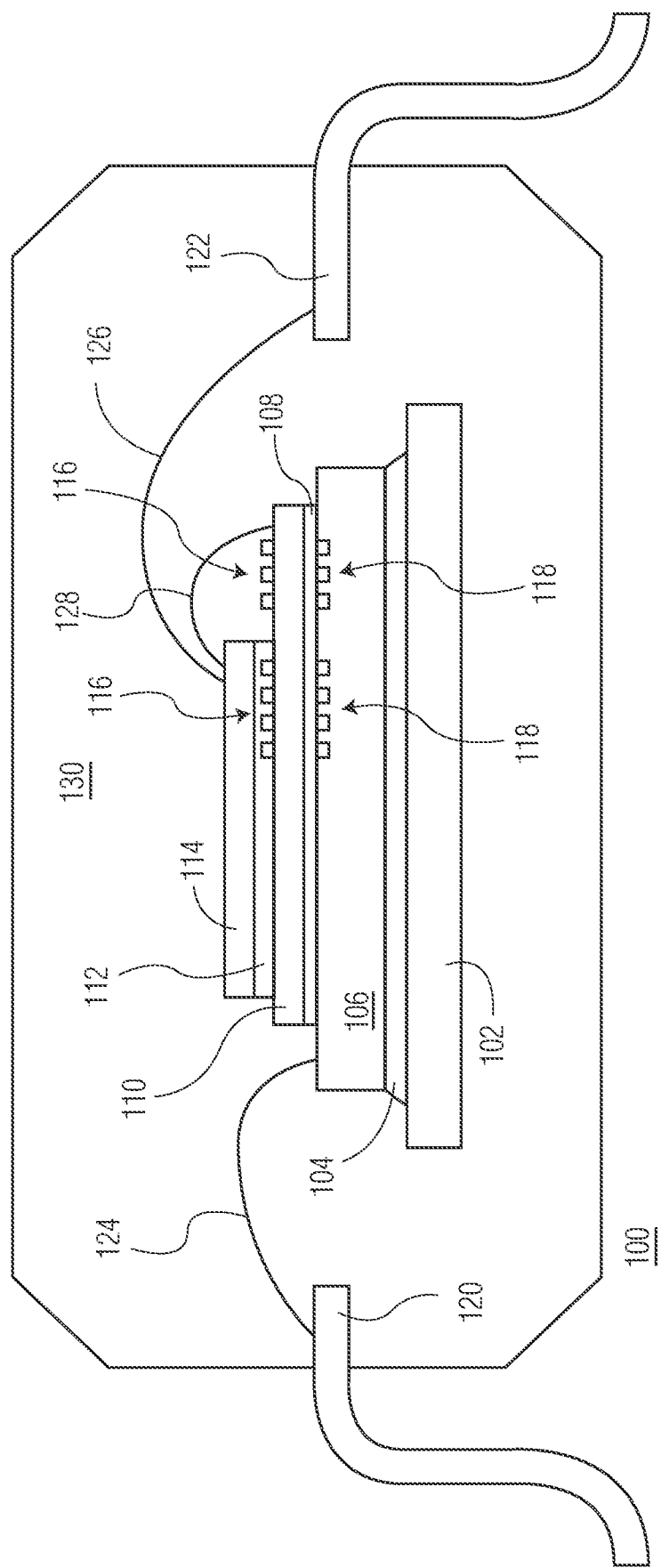
FIG. 1 illustrates a cross section of a packaged integrated circuit (IC) having stacked die and an isolation layer in accordance with one embodiment of the present invention.

FIG. 1 illustrates a cross-section of a packaged IC 100 having stacked IC die 106 and 114, in accordance with one embodiment of the present invention. When referring to the embodiment of FIG. 1, die 114 may be referred to as the top die and die 106 as the bottom die. Packaged IC 100 includes die 106 attached to a lead frame flag portion 102 with an adhesive 104. Die 106 includes an inductor coil 118 formed therein. Die 106 may also include other circuitry, as needed, formed therein. Die 114 is stacked on die 106 with an isolation layer 110 (also referred to as an isolation barrier or barrier layer) located between die 114 and die 106. Isolation layer 110 includes an inductor coil 116 on a top major surface of isolation layer 110. Isolation layer 110 may also include any number of metal layers, as needed, to route signals or power. In the illustrated embodiment, die 114 does not include (i.e. is devoid of) any inductor coil for transferring power with any other inductor coil outside of die 114. However, in one embodiment, die 114 may include a coil for GICL communication. Die 114 may include any other circuitry, as needed, formed therein. Inductor coil 116 is aligned with inductor coil 118 so that they may transfer power between each other.

Continuing with FIG. 1, a bottom major surface of isolation layer 110 is attached to a top major surface of die 106 via an adhesive layer 108. Note that adhesive layer 108 may extend fully under isolation layer 110. A bottom major surface of die 114 is attached to the top major surface of isolation layer 110 via an adhesive layer 112, which is located on a portion of inductor coil 116 located between die 114 and the top major surface of isolation layer 110. The lead frame also includes lead frame leads 120 and 122. A wire bond 126 is connected between a top major surface of die 114 and lead 122, a wire bond 128 is connected between the top major surface of die 114 and the top major surface of isolation layer 110, and a wire bond 124 is connected between the top major surface of die 106 and lead 120. An encapsulant 130 completely surrounds the stacked die 106 and 114, and wire bonds 126, 128, and 124.

Note that any number of leads may be present in the lead frame. Also, any number of wire bonds connected between the leads and die 106 or 114 or between die 114 and isolation layer 110 may be present, but they are not visible in the cross section of FIG. 1. Also, inductor coil 118 is illustrated as being on the "active" side of bottom die 106, but each may be located at either surface of the die, or buried within the die.

Figure 2:
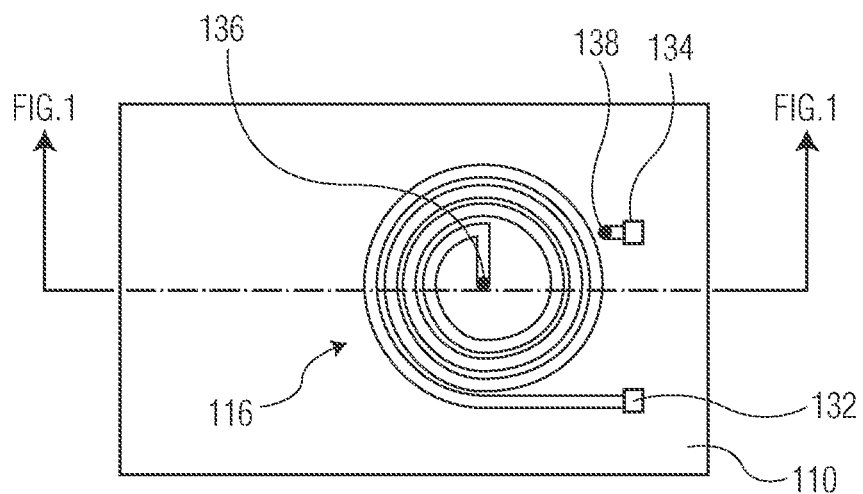
FIG. 2 illustrates a top down view of the isolation layer of the packaged IC of FIG. 1, in accordance with one embodiment of the present invention.

FIG. 2 illustrates a top down view of isolation layer 110 of packaged IC 100 of FIG. 1. In the top down view, inductor coil 116 is visible in which one end of coil 116 connects to a bond pad 132 and another end (at the center of the coil) is routed through via 136 on a different metal layer of isolation layer 110 to via 138 so that connection can be made to bond pad 134. Therefore, in the illustrated embodiment, bond pads 132 and 134 provide external connections to coil 116, such as for wire bonds.

In operation, inductor coil 118 in die 106 can transfer power with inductor coil 116, and then die 114 can receive power from inductor coil 116 via wire bonds connections, such as wire bond 128, which connects to a bond pad on the top major surface of isolation layer 110. Die 114 can also communicate with leads of the lead frame via wire bonds, such as wire bond 126 connected to lead 122. The efficiency in the transfer of power between coils depends on the ratio between the size of the inductor coil (i.e. the diameter of the coil, as measured between two outer edges of the coil) and the distance between the coils. Since inductor coil 116 is located on isolation layer 110 rather than in top die 114, inductor coil has the possibility of being larger that the size allowed by die 114. As illustrated in FIGS. 1 and 2, a portion of coil 116 is directly under die 114, between top die 114 and the top major surface of isolation layer 110, and another portion of coil 116 extends beyond die 114 such that it is not directly under die 114. The ability to size coil 116 in this manner can result in improved power transfer. (In alternate embodiments, coil 116 may not extend beyond die 114.) Since coil 116 is formed on the top major surface of isolation layer 110 rather than in die 114, it is also closer to coil 118. With the configuration of FIGS. 1 and 2, power can be transferred between die 114 and 106 via coils 116 and 118 while maintaining high voltage isolation. Also, the coils of coil 116 around the die edges of die 114 may provide corona shielding. In a preferred embodiment, coils 116 and 118 are aligned with each other with respect to both size and position. Although FIG. 1 depicts the coils of coil 116 and the coils of 118 as similar to each other, the width, spacing, and quantity of the coils may be different from each other.

Figure 3:
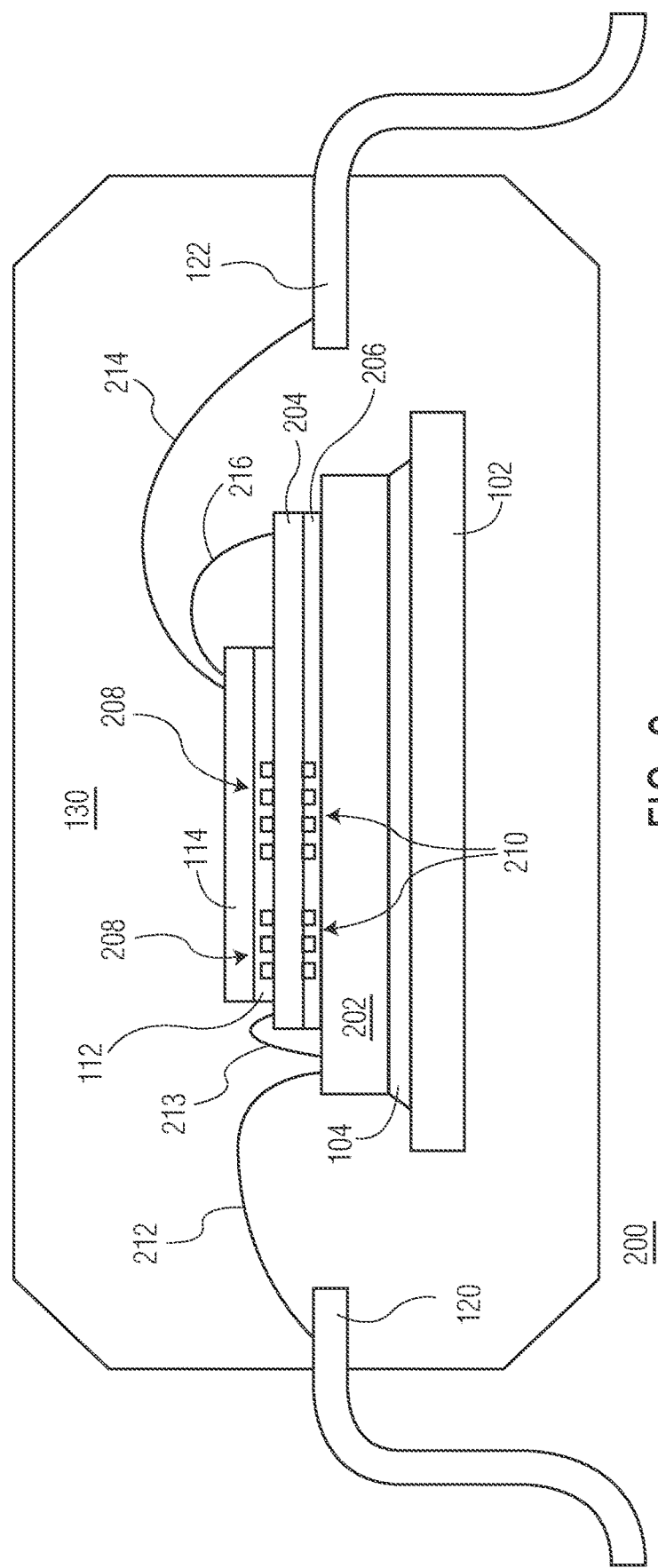
FIG. 3 illustrates a cross section of a packaged integrated circuit (IC) having stacked die and an isolation layer in accordance with one embodiment of the present invention.

FIG. 3 illustrates a cross-section of packaged IC 200 having stacked IC die 202 and 114, in accordance with one embodiment of the present invention. Note that like numerals with previous drawings refers to like elements, and thus may not be repeated with respect to this embodiment. When referring to the embodiment of FIG. 3, die 114 may be referred to as the top die and die 202 as the bottom die. Packaged IC 200 includes die 202 attached to lead frame flag portion 102 with adhesive 104. In this embodiment, unlike die 106 of FIG. 1, die 202 does not include any inductor coil for communicating power with any other inductor coil outside of die 202. However, die 202 may include a coil for GICL communication. Die 202 may include any other circuitry, as needed, formed therein. Die 114, as described above, also does not include any inductor coil for communicating power with any other inductor coil outside of die 114, and may include any other circuitry, as needed.

Die 114 is stacked on die 202 with an isolation layer 204 (also referred to as an isolation barrier or barrier layer) located between die 114 and die 202, similar to isolation layer 110. Isolation layer 204 includes an inductor coil 208 on a top major surface of isolation layer 204, and an inductor coil 210 on a bottom major surface of isolation layer 204. Inductor coils 208 and 210 are aligned with each other so that they may efficiently transfer power between each other. Isolation layer 204 may also include any number of metal layers, as needed, to route signals or power. A bottom major surface of isolation layer 204 is attached to a top major surface of die 202 via an adhesive layer 206. Note that adhesive layer 206 may extend fully under isolation layer 204. A bottom major surface of die 114 is attached to the top major surface of isolation layer 204 via an adhesive layer 112, which is located over inductor coil 208. A wire bond 214 is connected between the top major surface of die 114 and lead 122, a wire bond 216 is connected between the top major surface of die 114 and the top major surface of isolation layer 204, a wire bond 212 is connected between the top major surface of die 202 and lead 120, and a wire bond 213 is connected between the top major surface of die 202 and the top major surface of isolation layer 204. These wire bonds allow for communication and power transfer, as needed, between the coils and dies, and between the dies and leads. Encapsulant 130 completely surrounds the stacked die 202 and 114, and wire bonds 212, 213, 214, and 216.

As with FIG. 1, note that any number of leads may be present in the lead frame. Also, any number of wire bonds connected between the leads and die 202 or 114 or between die 114 and isolation layer 206 may be present, but they are not visible in the cross section of FIG. 3.

Figure 4:
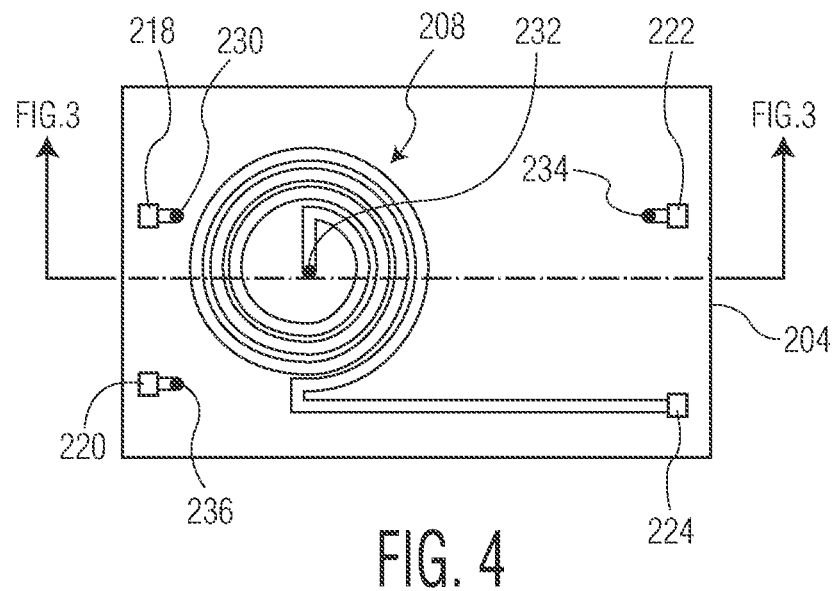
FIGS. 4 and 5 illustrate a top down view and a bottom up view, respectively, of the isolation layer of the packaged IC of FIG. 3, in accordance with one embodiment of the present invention.

FIG. 4 illustrates a top down view of isolation layer 204 of packaged IC 200 of FIG. 3. In the top down view, inductor coil 208 is visible in which one end of coil 208 connects to a bond pad 224 and another end (at the center of the coil) is routed through via 232, through another metal layer of isolation layer 204, to via 234 and to bond bad 222 on the top major surface of isolation layer 204. Therefore, in the illustrated embodiment, bond pads 222 and 224 provide external connections to coil 208, such as for wire bonds.

Figure 5:
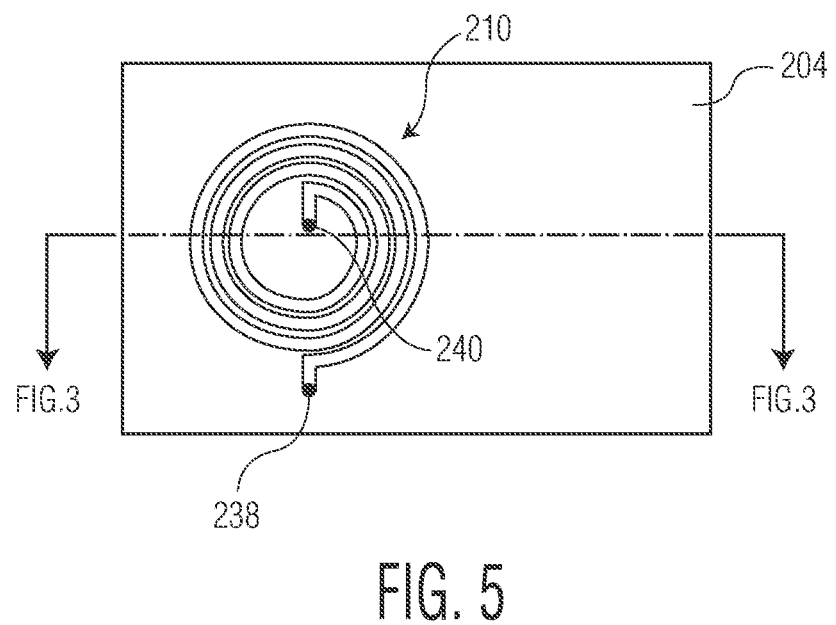

FIG. 5 illustrates a bottom up view of isolation layer 204 of packaged IC 200 of FIG. 3. In the bottom up view, inductor coil 210 is visible in which one end of coil 210 connects to a via 240 and another end to a via 238. In the illustrated embodiment, via 240 may be routed through another metal layer of isolation layer 204 to the top side of isolation layer 204 by way of via 230 to bond pad 218 (visible in FIG. 4), and via 238 may be routed through another metal layer of isolation layer 204 to the top side of isolation layer 204 by way of via 236 to bond pad 220 (also visible in FIG. 4). Therefore, bond pads 218 and 220 provide external connections to coil 210, such as for wire bonds. Any routing between the ends of the coils of coils 208 and 210 and bond pads on the top major surface of isolation layer 204 may be used.

In operation, inductor coil 208 transfers power with inductor coil 210. Die 114 can send or receive power from inductor coil 208 via wire bond connections, such as wire bond 216, which connects between a bond pad on the top major surface of isolation layer 204 and a bond pad on the top major surface of die 114. Die 202 can send or receive power from inductor coil 210 via wire bond connections, such as wire bond 213, which connects between a bond pad on the top major surface of isolation layer 204 and a bond pad on the top major surface of die 202. The efficiency in the transfer of power between coils depends on the ratio between the size of the inductor coil (i.e. the diameter of the coil, as measured between two outer edges of the coil) and the distance between the coils. Since both inductor coils 208 and 210 are located on a major surface of isolation layer 204 rather than in die 114 or die 202, they have the possibility of being larger than would be possible within a die. Also, coils 208 and 210 are only separated by the thickness of isolation layer 204, without any intervening layers of die 114, die 202, adhesive layer 112 or adhesive layer 206. In this manner, coils 208 and 210 can be placed in closer proximity with each other as compared to including either of coils 208 and 210 in a die of the stacked die. With the configuration of FIGS. 3-5, power can be transferred between die 114 and 202 via coils 208 and 210 while maintaining high voltage isolation. Also, the coils of coil 208 around the die edges of die 114 may provide corona shielding. In a preferred embodiment, coils 208 and 210 are aligned with each other with respect to both size and position. Although FIG. 4 depicts the coils of coil 208 and the coils of coil 210 as similar to each other, the width, spacing, and quantity of the coils may be different from each other.

Figure 6:
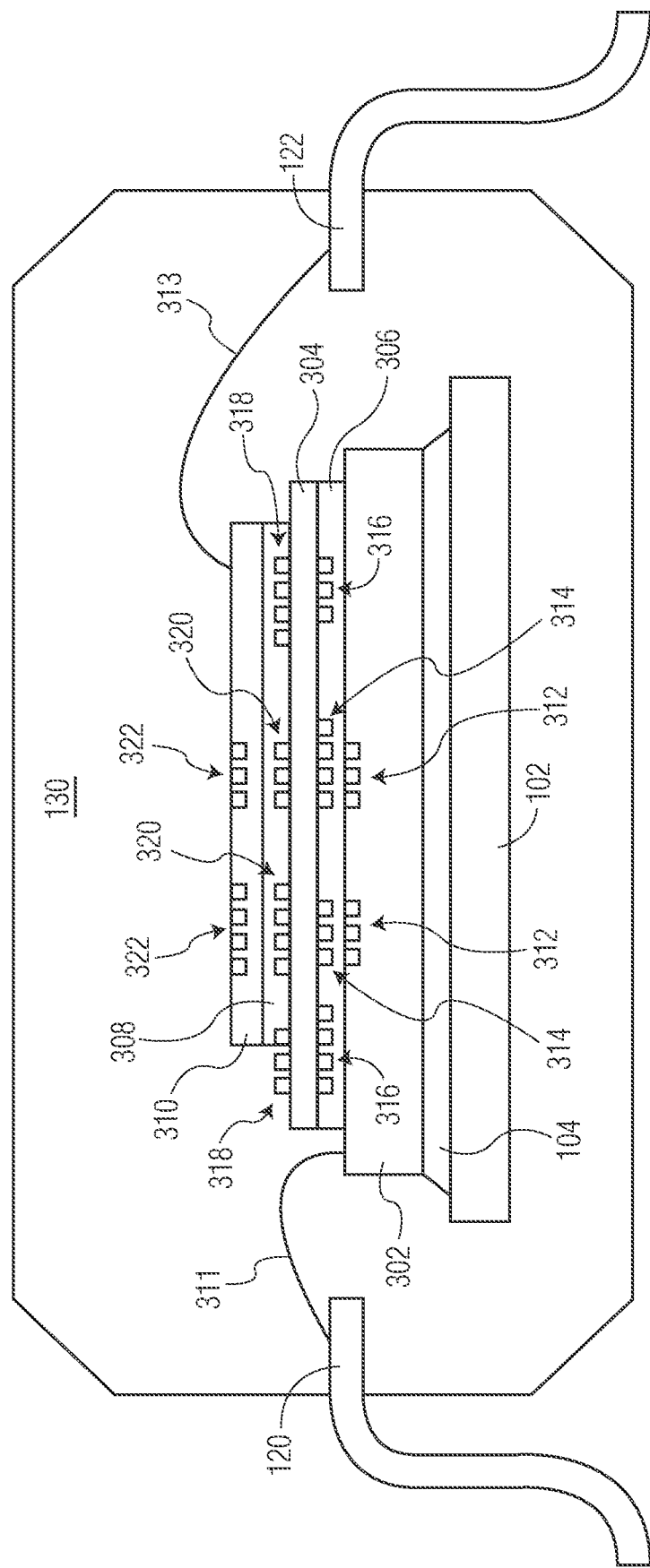
FIG. 6 illustrates a cross section of a packaged integrated circuit (IC) having stacked die and an isolation layer in accordance with one embodiment of the present invention.

FIG. 6 illustrates a cross-section of packaged IC 300 having stacked IC die 302 and 310, in accordance with one embodiment of the present invention. Note that like numerals with previous drawings refers to like elements, and thus may not be repeated with respect to this embodiment. When referring to the embodiment of FIG. 6, die 310 may be referred to as the top die and die 302 as the bottom die. Packaged IC 300 includes die 302 attached to lead frame flag portion 102 with adhesive 104. Die 302 includes an inductor coil 312 formed therein. Die 302 may also include other circuitry, as needed, formed therein. Die 310 includes an inductor coil 322 formed therein. Die 310 may also include other circuitry, as needed, formed therein. Inductor coils 312 and 322 are illustrated as being on the "active" side of each die, but each may be located at either surface of the die, or buried within the die.

Continuing with FIG. 6, die 310 is stacked on die 302 with an isolation layer 304 (also referred to as an isolation barrier or barrier layer) located between die 310 and die 302, similar to isolation layers 110 and 204. Isolation layer 304 includes inductor coils 318 and 320 on a top major surface of isolation layer 304, in which smaller coil 320 is completely nested within larger coil 318. (In alternate embodiments, the smaller coil may not be completely nested in the larger coil.) Isolation layer 304 also includes inductor coils 316 and 314 on a bottom major surface of isolation layer 304, in which smaller coil 314 is completely nested within larger coil 316. Larger inductor coils 318 and 316 are aligned with each other and smaller inductor coils 320 and 314 are aligned with each other. However, since smaller inductor coils 320 and 314 do not coupled as well together as the larger coils, they may not be aligned. In this manner, power can be transferred through isolation layer 304 between coils 318 and 316 and possibly between coils 320 and 314. Isolation layer 304 may also include any number of metal layers, as needed, to route signals or power.

A bottom major surface of isolation layer 304 is attached to a top major surface of die 302 via an adhesive layer 306. Note that adhesive layer 306 may extend fully under isolation layer 304, and adhesive layer 306 fully covers coils 314 and 316 on the bottom major surface of isolation layer 304. In the case in which coil 316 extends beyond the edge of die 302, adhesive layer 306 may not fully cover coil 316. A bottom major surface of die 310 is attached to the top major surface of isolation layer 304 via an adhesive layer 308, which is located on inductor coil 320, and may also be located on a portion of inductor coil 318. Therefore, while adhesive layer 306 covers any coil on a bottom major surface of isolation layer 304, adhesive layer 308 is located only on the portions of coils 320 and 328 which are directly under top die 310. A wire bond 313 is connected between the top major surface of die 310 and lead 122, and a wire bond 311 is connected between the top major surface of die 302 and lead 120. Encapsulant 130 completely surrounds the stacked die 302 and 310, and wire bonds 311 and 313.

As with the above embodiments, note that any number of leads may be present in the lead frame. Also, any number of wire bonds connected between the leads and die 302 and 310 may be present, but they are not visible in the cross section of FIG. 6.

Figure 7:
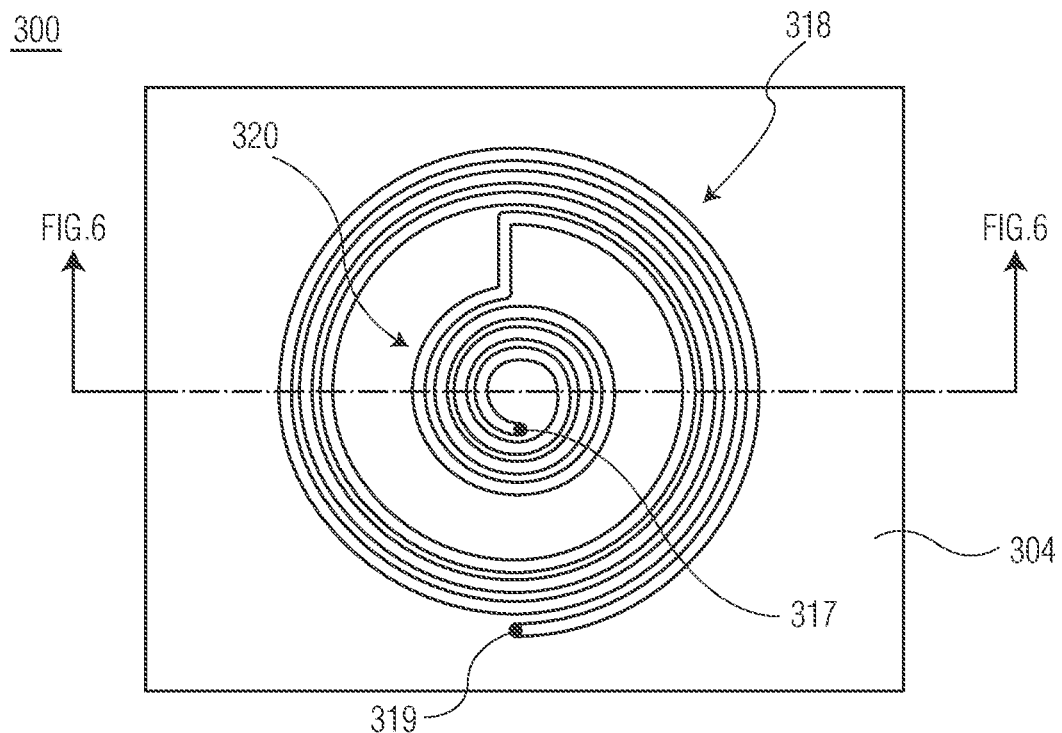
FIGS. 7 and 8 illustrate a top down view and a bottom up view, respectively, of the isolation layer of the packaged IC of FIG. 3, in accordance with one embodiment of the present invention.

FIG. 7 illustrates a top down view of isolation layer 304 of packaged IC 300 of FIG. 6. In the top down view, inductor coil 318 is visible in which one end of coil 318 starts at via 319 and a second end of coil 318 connects to a first end of smaller coil 320, nested within coil 318. A second end of smaller coil 320 is connected to a via 317. Vias 317 and 319 can be used to route signals to connect to coils 318 and 320 as needed, through other metal layers of isolation layer 304.

Figure 8:
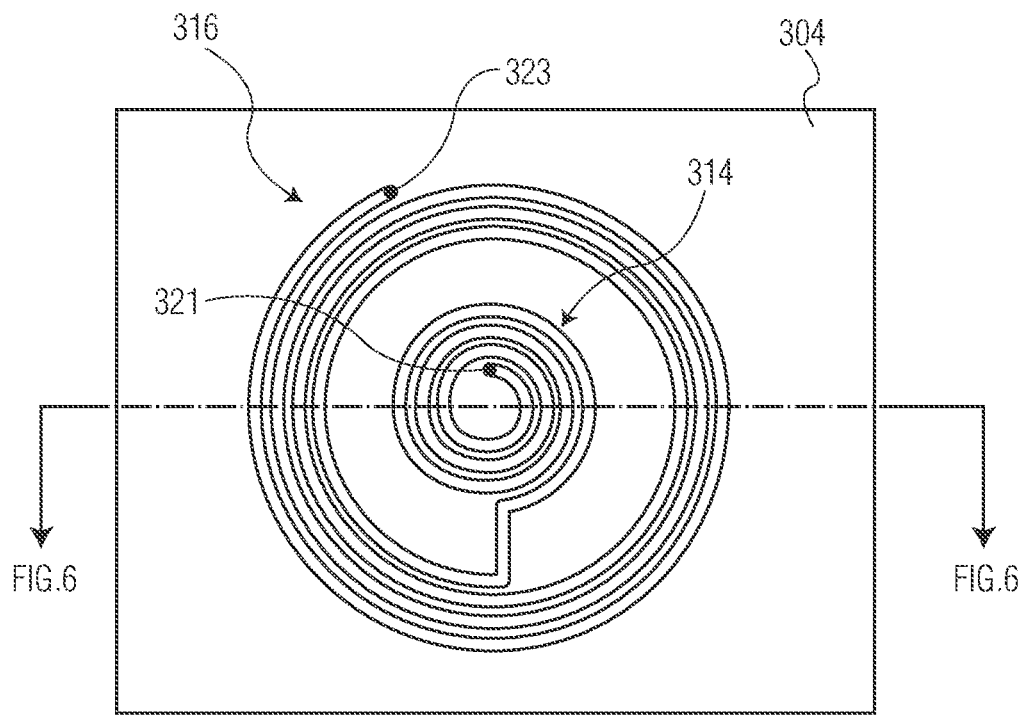

FIG. 8 illustrates a bottom up view of isolation layer 304 of packaged IC 300 of FIG. 6. In the bottom up view, inductor coil 316 is visible in which one end of coil 316 starts at via 323 and a second end of coil 316 connects to a first end of smaller coil 314, nested within coil 316. A second end of smaller coil 314 is connected to via 321. Vias 323 and 321 can be used to route signals to connect to coils 314 and 316 as needed, through other metal layers of isolation layer 304.

In operation, inductor coil 312 in die 302 and inductor coil 314 in isolation layer 304 are aligned so that power is transferred between coils 314 and 312. Similarly, inductor coil 322 in die 310 and inductor coil 320 are aligned so that power is transferred between the coils. Larger coils 316 and 318, both on major surfaces of isolation layer 304 and not located in either die 302 or die 310, can better couple or enhance the signals or power transferred by smaller coils 320 and 314 and the respective die. Die 310 can communicate with lead 122 via wire bond 313, and die 302 can communicate with lead 120 via wire bond 311. As described above, the efficiency in the transfer of power between coils depends on the ratio between the size of the inductor coil (i.e. the diameter of the coil, as measured between two outer edges of the coil) and the distance between the coils. Since both larger inductor coils 318 and 316 are located on a major surface of isolation layer 304 rather than in die 310 or die 302, they can have the possibility of being larger than would be possible within a die. Also, coils 318/320 and 316/314 are only separated by the thickness of isolation layer 304. Coils 312 and 314 are only separated by adhesive layer 306, and with coil 320 being on the top major surface of isolation layer 304, it is separated from coil 322 by adhesive layer 308 and a portion of thickness of die 310, but not also by the thickness of isolation layer 304. In this manner, the distance between coils transferring power is reduced as compared to having the inductor coils only be in the stacked die. With the configuration of FIGS. 6-8, power can be transferred between die 302 and 310 via coils 318/320 and 316/314 while maintaining high voltage isolation. Also, the coils of coil 318 and 316 around the die edges of die 310 may provide corona shielding. In a preferred embodiment, coils 320 and 322 and coils 314 and 312 are aligned with each other, respectively, with respect to both size and position.

Although FIGS. 6-8 depict the coils of coil 320 and coil 322, the coils of coil 318 and coil 316, and the coils of coil 314 and coil 312 as similar to each other, the width, spacing, and quantity of the coils may be different from each other.

Figure 9:
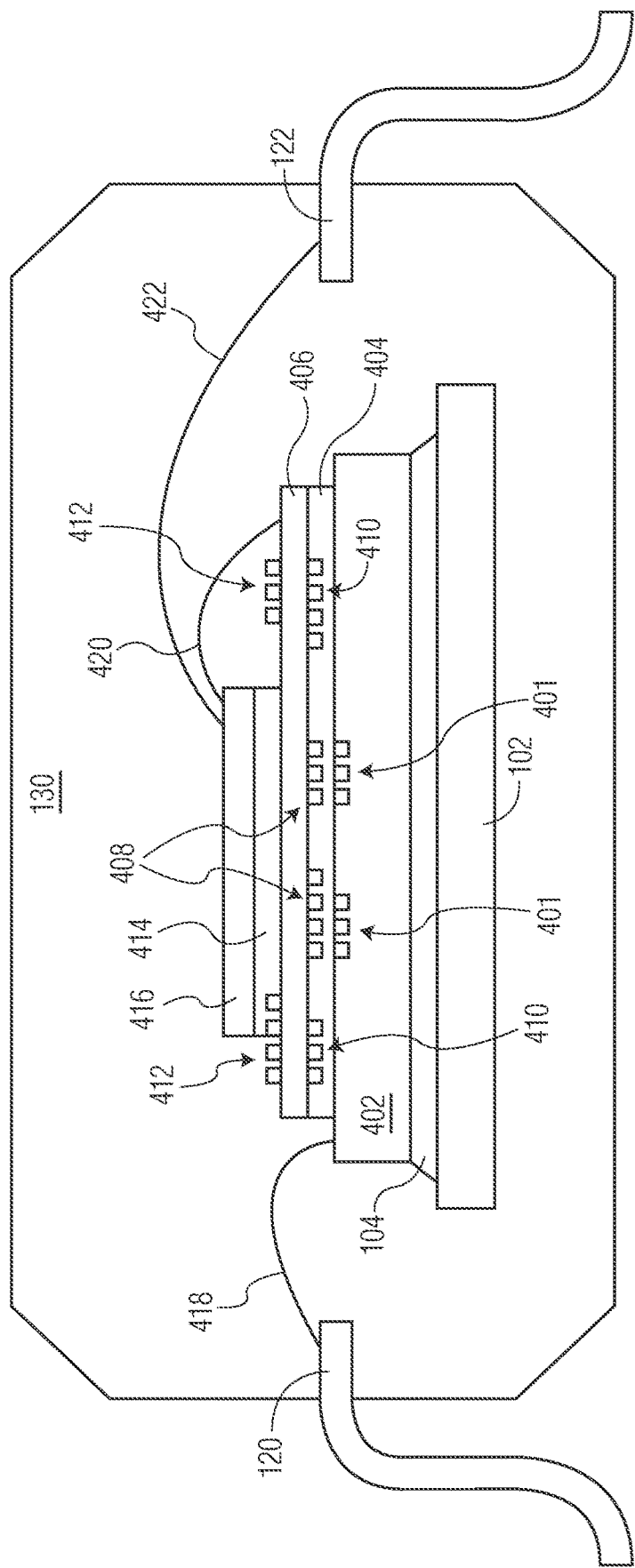
FIG. 9 illustrates a cross section of a packaged integrated circuit (IC) having stacked die and an isolation layer in accordance with one embodiment of the present invention.

FIG. 9 illustrates a cross-section of packaged IC 400 having stacked IC die 402 and 416, in accordance with one embodiment of the present invention. Note that like numerals with previous drawings refers to like elements, and thus may not be repeated with respect to this embodiment. When referring to the embodiment of FIG. 9, die 416 may be referred to as the top die and die 402 as the bottom die. Packaged IC 400 includes die 402 attached to lead frame flag portion 102 with adhesive 104. Die 402 includes an inductor coil 401. Die 402 may also include any other circuitry, as needed, formed therein. Die 416, similar to die 114 above, also does not include any inductor coil for communicating power with any other inductor coil outside of die 416, and may include any other circuitry, as needed, and may include a coil for GICL communication.

Die 416 is stacked on die 402 with an isolation layer 406 (also referred to as an isolation barrier or barrier layer) located between die 416 and die 402, similar to the isolation layers described in the above embodiments. Isolation layer 406 includes an inductor coil 412 on a top major surface of isolation layer 406. Isolation layer 406 also includes a smaller inductor coil 408 nested within a larger inductor coil 410 on a bottom major surface of isolation layer 406. Inductor coil 412 is sized like inductor coil 410 and are aligned with each other so that they may transfer power between each other. Isolation layer 406 may also include any number of metal layers, as needed, to route signals.

A bottom major surface of isolation layer 406 is attached to a top major surface of die 402 via an adhesive layer 404. Note that adhesive layer 404 may extend fully under isolation layer 406. A bottom major surface of die 416 is attached to the top major surface of isolation layer 406 via an adhesive layer 414, which is located on a portion of inductor coil 412. A wire bond 422 is connected between the top major surface of die 416 and lead 122, a wire bond 420 is connected between the top major surface of die 416 and the top major surface of isolation layer 406, and a wire bond 418 is connected between the top major surface of die 402 and lead 120. Encapsulant 130 completely surrounds the stacked die 402 and 416, and wire bonds 418, 420, and 422.

As with the above embodiments, note that any number of leads may be present in the lead frame. Also, any number of wire bonds connected between the leads and die 402 or 416 or between die 416 and isolation layer 406 may be present, but they are not visible in the cross section of FIG. 9.

Figure 10:
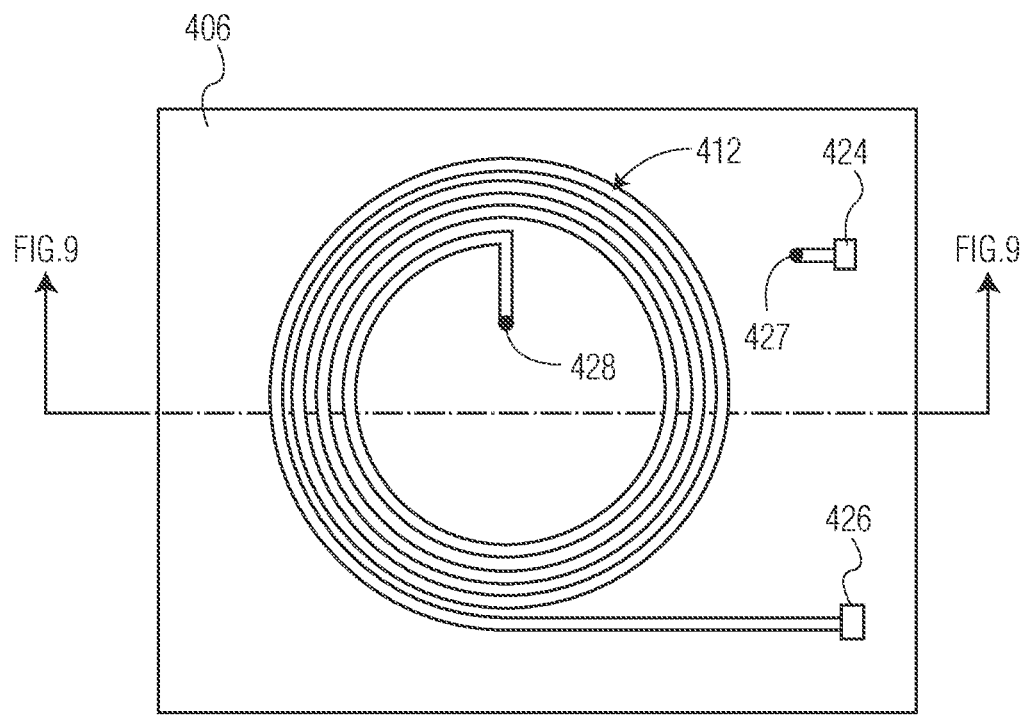
FIGS. 10 and 11 illustrate a top down view and a bottom up view, respectively, of the isolation layer of the packaged IC of FIG. 3, in accordance with one embodiment of the present invention.

FIG. 10 illustrates a top down view of isolation layer 406 of packaged IC 400 of FIG. 9. In the top down view, inductor coil 412 is visible in which one end of coil 412 connects to a bond pad 426 and another end (at the center of the coil) is routed by way of via 428 to another metal layer of isolation layer 406, to via 427 to bond pad 424. Therefore, in the illustrated embodiment, bond pads 426 and 424 provide external connections to coil 412, such as for wire bonds.

Figure 11:
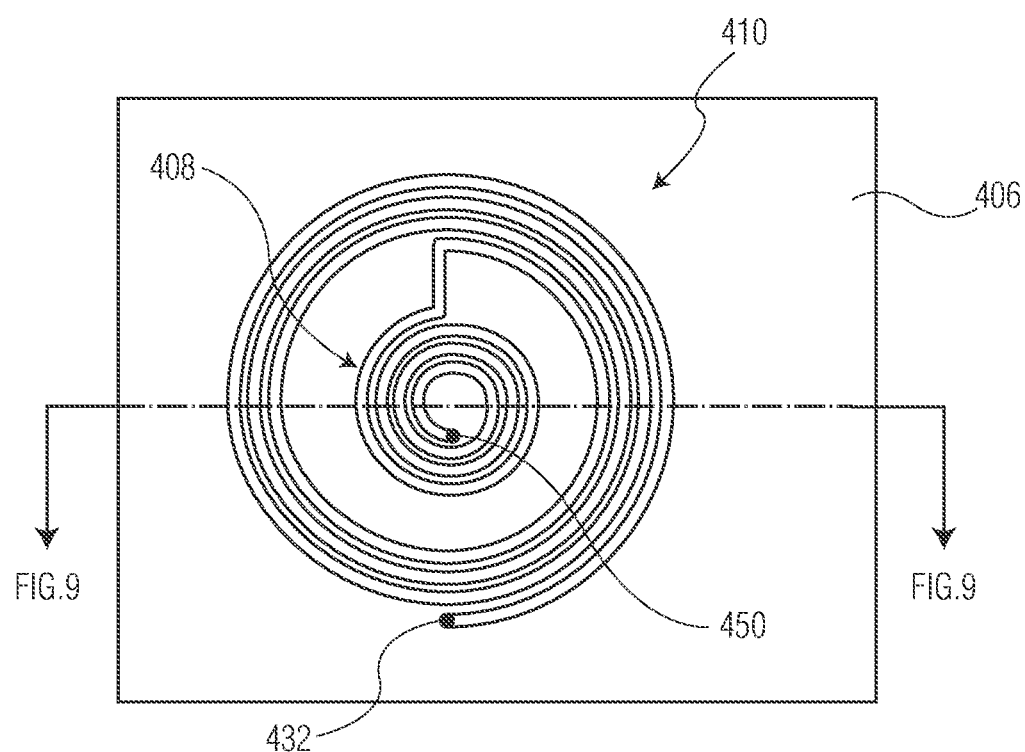

FIG. 11 illustrates a bottom up view of isolation layer 406 of packaged IC 400 of FIG. 9. In the bottom up view, inductor coil 410 is visible in which one end of coil 410 starts at via 432 and a second end of coil 410 connects to a first end of smaller coil 408, nested within coil 410. A second end of smaller coil 408 is connected to via 450. Vias 432 and 450 can be used to route signals to connect to coils 410 and 408, as needed, through other metal layers of isolation layer 406.

In operation, inductor coil 412 transfers power with inductor coil 410, and inductor 408 can transfer power with inductor 401 in die 402. Die 416 can receive power from inductor coil 412 via wire bond connections, such as wire bond 420, which connects between a bond pad on the top major surface of isolation layer 406 and a bond pad on the top major surface of die 416. Inductor coil 401 in die 402 can transfer power with inductor coil 408, and coil 410 can enhance the signals on coil 408 for better transfer with coil 412. Die 416 can also communicate with lead 122 via wire bond connections, such as wire bond 422. The efficiency in the transfer of power between coils depends on the ratio between the size of the inductor coil (i.e. the diameter of the coil, as measured between two outer edges of the coil) and the distance between the coils. Since both larger inductor coils 412 and 410 are located on major surfaces of isolation layer 406 rather than in die 416 or die 402, they can have the possibility of being larger than would be possible within a die. Also, coils 410 and 412 are only separated by the thickness of isolation layer 406, and coils 408 and 401 are only separated by the thickness of adhesive layer 404. With the configuration of FIGS. 9-11, power can be transferred between die 416 and 402 via coils 408 and 401 and coils 410 and 412 while maintaining high voltage isolation. Also, the coils of coil 412 and 410 around the die edges of die 416 may provide corona shielding. In a preferred embodiment, coils 412 and 410 and coils 408 and 401, are aligned with each other, respectively, with respect to both size and position. Although FIGS. 9-11 depict the coils of coil 412 and coil 410 and the coils of coil 408 and coil 401 as similar to each other, the width, spacing, and quantity of the coils may be different from each other.

In the above embodiments, one of the stacked die may be coupled to receive low voltage signals from leads and the other of the stacked die may be coupled to receive high voltage signals from leads, in which the high voltage is higher than the low voltage. As can be seen in the above stacked die embodiments, the isolation layer extends a prespecified distance beyond the edges of the top die. In one embodiment, this prespecified distance ensures that dielectric breakdown does not occur in the encapsulant. For example, this distance may be 500 micrometers. In one embodiment, the prespecified distance is the same as measured from all four edges, or they can be varying or different on each side of the top die. In alternate embodiments, note that the isolation layer may also extend beyond some of the edges (or minor surfaces) of the bottom die to further increase internal creepage.

The above embodiments, by placing an inductive coil on at least one major surface of the isolation layer itself rather than only in the top or bottom die, the distance between aligned coils for power transfer can be minimized. Also, note that each pair of inductor coils transferring power includes a transmitting or receiving inductor in which each inductor coil described above can be a transmitting or receiving inductor. Although the thickness of isolation layer affects the distance between power transferring coils, the isolation layer should have a thickness which provides galvanic isolation and protects against breakdown of the isolation layer. That is, while the inductors transfer power, isolation layer provides AC and DC electrical isolation. Isolation layer may include a dielectric, epoxy, bismaleimide triazine (BT), FR-4, polyimide, or a resin and may have a thickness in a range of 40-200 micrometers, and, as described above, may include one or more metal layers to route power and signals, as needed. Also, in alternate embodiments, different types of adhesive layers may be used in which the alignment of the adhesive layers to the isolation layers or the top or bottom die may be different that illustrated in FIGS. 1-11. The coils, connectors, vias, and conductors described herein may be formed from copper (Cu) or other electrically conductive materials.

Figure 12:
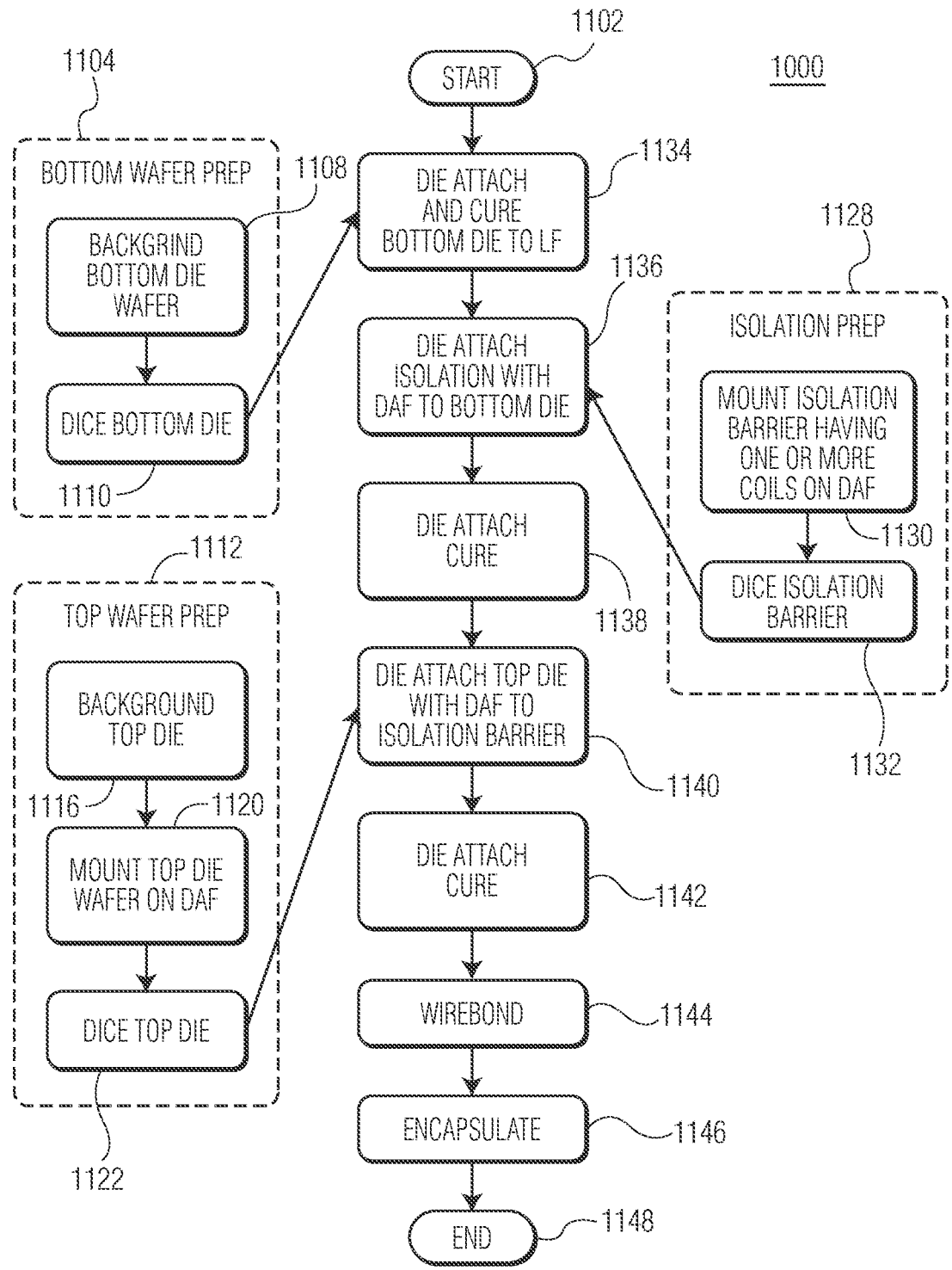
FIG. 12 illustrates, in flow diagram form, a method for forming a packaged IC with stacked die, in accordance with one embodiment of the present invention

Further details of the illustrated embodiments of the packaged ICs described in references to FIGS. 1-11 are provided in reference to the formation of a packaged IC illustrated in method 1000 of FIG. 12. In FIG. 12, reference to elements of the packaged IC assembly (e.g. bottom die, top die, flag portion, adhesive, etc.) may refer to the elements in any of the embodiments of FIGS. 1-11. In block 1104, the bottom die wafer (containing the bottom die) is prepared by backgrinding the bottom die wafer to a desired thickness in block 1108 and dicing the bottom die wafer to singulate the die in block 1110. Method 1000 begins at start 1102 and proceeds to block 1134 in which the bottom die is attached to a lead frame flag portion using an epoxy die attach material as the adhesive. The bottom die may be, for example, die 106, die 202, die 302, or die 402. After attaching the bottom die to the flag portion, the assembly is cured.

In block 1128, an isolation layer having one or more inductor coils formed on its top major surface or bottom major surface or both is prepared by mounting this isolation layer with one or more inductor coils onto a die attach film (DAF) in block 1130. The isolation layer (having with the one or more inductor coils) mounted onto the DAF is then diced in block 1132, to result in a pre-formed isolation layer with one or more coils. That is, the isolation layer with the one or more coils is fully formed prior to attachment to the bottom die. In the case that the isolation layer includes a coil on its bottom major surface, upon mounting the isolation layer onto the DAF, the coil would be located between the bottom major surface of the isolation layer and the DAF, and the DAF would be covering the coil.

Returning to method 1000, after block 1134, method 1000 proceeds to block 1136 in which the pre-formed isolation layer with the one or more coils and the DAF is attached to the bottom die. In this embodiment, the pre-formed isolation layer and the DAF is, e.g., isolation layer 110 and adhesive layer 108, or isolation layer 204 and adhesive layer 206, or isolation layer 304 and adhesive layer 306, or isolation layer 406 and adhesive layer 404. Since the isolation layer is pre-formed and mounted on the DAF, the combined thickness of the isolation layer and adhesive layer can be uniform and tightly controlled. If a gel or paste adhesive were used rather than a DAF for the adhesive layer, the resulting thickness would be less controlled. Afterwards, the assembly of the bottom die with the isolation layer and adhesive layer is cured in block 1138.

In block 1112, the top die wafer (containing the top die) is prepared by backgrinding the top die wafer to a desired thickness in block 1116, mounting the top die wafer to a DAF in block 1120, and dicing the top die wafer with the DAF to singulate the top die in block 1122. Method 1000 continues after block 1138 to block 1140 in which the singulated top die mounted on the DAF is attached to the isolation layer having the one or more inductor coils. Therefore, the singulated top die and DAF may be die 114 and adhesive layer 112, die 310 and adhesive layer 308, or die 416 and adhesive layer 414. Note that if the isolation layer includes a coil on its top major surface, the top die and DAF may not fully cover this coil, such as in the embodiments of FIG. 1, 6, or 9. Also, similar to the DAF used for the isolation layer, the use of a DAF for attaching the top die to the isolation layer allows for the resulting thickness of layers between the bottom and top die to be uniform and tightly controlled. In alternate embodiments, other adhesive layers may be used which allow for a controlled thickness. Again, if a gel or paste adhesive were used, the resulting thickness may be less controlled. In one embodiment, a combined thickness of the isolation layer and adhesive layers on either side of the isolation layer is between 50 and 500 micrometers, or preferably, in between 50 and 200 micrometers, or more preferably, between 90 and 110 micrometers.

After block 1140, method 1000 proceeds with block 1142 in which the assembly having the bottom die, the isolation layer, and the top die is cured to cure the adhesive layer on which the top die wafer is mounted. In an alternate embodiment, the cure of block 1138 may not be performed, in which case, only the cure in block 1142 would be performed to cure the adhesive layers. After block 1142, method 1000 proceeds to block 1144 in which wire bond connections are formed. These wire bond connections may include wire bonds between the lead frame leads and the bottom die, between the bottom die and the isolation layer, between the lead frame leads and the top die, or between the top die and the isolation layer, or combinations thereof, as needed. Note that since power transfer and signal transfer may be performed by way of the one or more inductor coils on the isolation layer, wire bond connections between the top die and the bottom die are not needed.

Method 1000 continues with block 1146 in which the stacked assembly, including the bottom die, the isolation layer, the top die, and the wire bonds, are encapsulated with an encapsulant. Any known techniques may be used to form the wire bonds and to encapsulate the die. Additional steps may be performed, such as trimming and forming of leads, to result in substantially completed packaged IC, such as, for example, packaged IC 100, 200, 300, or 400. Method 1000 ends at end 1148.

Note that the off-line preparation blocks, such as blocks 1104, 1128, and 1112, can be performed before beginning method 1000. Also, they can be performed in any order. Also, note that although two die are illustrated, any number of die and pre-formed isolation layers may be used, as needed. Furthermore, the pre-formed isolation layer may have various different sizes and shapes. Although the illustrated embodiment is in reference to a lead frame based package, other packages may be used which also include stacked die with intervening pre-formed isolation layers. For example, an isolation layer such as those described above, may be used for ball grid array (BGA) packages with organic or inorganic substrates.

As described above in reference to the larger inductor coils such as, for example, coils 116, 208, 318 and 412, may ensure that the corners of the top die are within an inductor coil. Since the electric field strength around die corners formed as a result of the dicing process is much higher than in flat areas, the insulation material (of the isolation layer having the one or more coils) is more prone to breakdown at these corners. Therefore, the coils of the larger inductor coils, with rounded corners, reduces the electric field strength near the die corners and thus reduces the risk of a corona effect which can result in destruction of the isolation layer under high voltage stress.

Therefore, by now it can be appreciated that a stacked die package is provided which provides galvanic isolation between the die to allow for effective transfer of power between the top and bottom die using one or more inductor coils located on at least one major surface of the isolation layer between the top and bottom die. A pre-formed isolation layer having the one or more inductor coils is used to provide isolation between adjacent stacked die. By having one or more inductor coils formed directly on a top major surface, bottom major surface, or both major surfaces, of the isolation layer between the top and bottom die, a larger ratio between the size (i.e. diameter) of the inductor coil and the distance between the transmitting and receiving inductor coils can be maintained for improved transfer of power. The larger this ratio, the more efficient the power transfer, and in one embodiment, at least 100 mW of power can be transferred between coils on the isolation layer or a coil on the isolation layer and a coil in the top or bottom die. With one or more coils being located on the isolation layer rather than in the top or bottom die, larger coils and tighter distances between transmitting/receiving coils can be achieved, which allows for power transfer, in addition to signal transfer, between the stacked die.

It should also be appreciated that the IC die as referenced herein may refer to any of a variety of electronic components, including but not limited to a semiconductor device, a passive device, such as a relay, a resistor, an inductor, a capacitor, a diode, a power transistor, an oscillator, and the like, or other types of electronic devices.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different packaging technologies may be used other than lead frames, and different adhesive layers may be used other than DAFs. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a packaged integrated circuit (IC) device includes a first IC die; a first layer of adhesive on a first major surface of the first IC die; an isolation layer over the first layer of adhesive, wherein the isolation layer has a first major surface and a second major surface, and the second major surface of the isolation layer is between the first layer of adhesive and the first major surface. The packaged IC device also includes a first inductor coil on the first major surface of the isolation layer; a second layer of adhesive on the isolation layer; and a second IC die on the second layer of adhesive. In one aspect of this embodiment, the second IC die is located directly over at least a first portion of the first inductor coil. In a further aspect, a second portion of the first inductor coil is not located directly under the second IC die. In a further aspect, the first inductor coil includes an outer coil surrounding a smaller nested coil, wherein the first portion of the first inductor coil includes the smaller nested coil. In yet a further aspect, the second portion of the first inductor coil includes a portion of the outer coil. In another aspect of this embodiment, the packaged IC device further includes a second inductor coil on the second major surface of the isolation layer, such that the second inductor coil is between the second major surface of the isolation layer and the first layer of adhesive, wherein the second inductor coil is aligned to the first inductor coil to transfer power between the first and second inductor coils. In a further aspect, the second inductor coil is fully covered by the first layer of adhesive. In another further aspect, the second inductor coil includes an outer coil surrounding and connected to a smaller nested coil. In yet a further aspect, the first inductor coil is aligned with the outer coil of the second inductor coil to transfer power between the first inductor coil and the second inductor coil. In another yet further aspect, the first inductor coil includes an outer coil surrounding and connected to a smaller nested coil, wherein the outer coils of the first and second inductor coils are aligned with each other to transfer power and the smaller nested coils of the first and second inductor coils are aligned with each other to transfer power. In another further aspect, the second IC die is devoid of an inductive coil which transfers power with either the first or the second inductor coils. In yet a further aspect, the first IC die is devoid of an inductive coil which transfers power with either the first or the second inductor coils. In another aspect of this embodiment, the packaged IC further includes a lead frame flag, wherein the first die is attached to the lead frame flag; wire bonds between the first IC die and a first set of lead fingers; and wire bonds between the second IC die and a second set of lead fingers. In a further aspect, the packaged IC device further includes wire bonds between the second IC die and the isolation layer. In yet another aspect of this embodiment, the second IC die is devoid of inductive coils which communicate with the first inductor coil.

In another embodiment, a method of making a packaged integrated circuit (IC) device includes attaching a bottom side of a first IC die to a lead frame; receiving a pre-formed isolation barrier layer having a first inductor coil formed on either the bottom side or a top side of the pre-formed isolation barrier layer and a first adhesive layer attached to the bottom side of the pre-formed isolation barrier layer, wherein when the first inductor coil is on the bottom side of the pre-formed isolation barrier layer, the first inductor coil is between the bottom side of the pre-formed isolation barrier and the first adhesive layer; attaching the pre-formed isolation barrier layer to a top side of the first IC die with the first adhesive layer between the top side of the first IC die and the bottom side of the pre-formed isolation barrier; and attaching a second IC die to the top side of the isolation barrier with a second adhesive layer between the top side of the isolation barrier and a bottom side of the second IC die, wherein the second IC is located directly over at least a first portion of the first inductor coil, wherein when the first inductor coil is on the top side of the pre-formed isolation barrier layer, the first inductor coil is between the top side of the pre-formed isolation barrier layer and the second adhesive layer. In one aspect of this another embodiment, the first inductor coil is on the top side of the isolation barrier layer, and the isolation barrier layer includes a second inductor coil formed on the bottom side of the isolation barrier layer, wherein the second inductor coil is aligned to the first inductor coil to transfer power between the first and second inductor coils. In a further aspect, each of the first IC die and the second IC die is devoid of an inductor coil which transfers power with the first or the second inductor coils and the method further includes forming wire bonds between contacts on the first IC die and a first set of lead fingers; forming wire bonds between contacts on the second IC die and a second set of lead fingers; forming wire bonds between contacts on the second IC die and contacts on the isolation barrier layer; and encapsulating the lead frame flag, first IC die, pre-formed isolation barrier layer, second IC die, and wire bonds. In another aspect of the another embodiment, the first IC die includes a second inductor coil aligned with the first inductor coil to transfer power between the first and second inductor coils, and the second IC die is devoid of any inductor coils, and the method further includes forming wire bonds between contacts on the first IC die and a first set of lead fingers; forming wire bonds between contacts on the second IC die and a second set of lead fingers; forming wire bonds between contacts on the second IC die and contacts on the isolation barrier layer; and encapsulating the lead frame flag, first IC die, pre-formed isolation barrier layer, second IC die, and wire bonds. In yet another aspect of the another embodiment, a second portion of the first inductor coil extends beyond an edge of the second IC die.

What is claimed is:

1. A packaged integrated circuit (IC) device comprising:
a first IC die;
a first layer of adhesive on a first major surface of the first IC die;
an isolation layer over the first layer of adhesive, the isolation layer having a first major surface and a second major surface, wherein the second major surface of the isolation layer is between the first layer of adhesive and the first major surface;
a first inductor coil directly on the first major surface of the isolation layer;
a second layer of adhesive on the isolation layer; and
a second IC die on the second layer of adhesive wherein the second IC die does not include the first inductor coil.

2. The packaged IC device of claim 1, wherein the second IC die is located directly over at least a first portion of the first inductor coil.

3. A packaged integrated circuit (IC) device comprising:
a first IC die;
a first layer of adhesive on a first major surface of the first IC die;
an isolation layer over the first layer of adhesive, the isolation layer having a first major surface and a second major surface, wherein the second major surface of the isolation layer is between the first layer of adhesive and the first major surface;
a first inductor coil on the first major surface of the isolation layer;
a second layer of adhesive on the isolation layer; and
a second IC die on the second layer of adhesive, wherein the second IC die is located directly over at least a first portion of the first inductor coil, and wherein a second portion of the first inductor coil is not located directly under the second IC die.

4. The packaged IC device of claim 3, wherein the first inductor coil includes an outer coil surrounding a smaller nested coil, wherein the first portion of the first inductor coil includes the smaller nested coil.

5. The packaged IC device of claim 4, wherein the second portion of the first inductor coil includes a portion of the outer coil.

6. A packaged integrated circuit (IC) device comprising:
a first IC die;
a first layer of adhesive on a first major surface of the first IC die;
an isolation layer over the first layer of adhesive, the isolation layer having a first major surface and a second major surface, wherein the second major surface of the isolation layer is between the first layer of adhesive and the first major surface;
a first inductor coil on the first major surface of the isolation layer;
a second layer of adhesive on the isolation layer;
a second IC die on the second layer of adhesive; and
a second inductor coil on the second major surface of the isolation layer, such that the second inductor coil is between the second major surface of the isolation layer and the first layer of adhesive, wherein the second inductor coil is aligned to the first inductor coil to transfer power between the first and second inductor coils.

7. The packaged IC device of claim 6, wherein the second inductor coil is fully covered by the first layer of adhesive.

8. The packaged IC device of claim 6, wherein the second inductor coil includes an outer coil surrounding and connected to a smaller nested coil.

9. The packaged IC device of claim 8, wherein the first inductor coil is aligned with the outer coil of the second inductor coil to transfer power between the first inductor coil and the second inductor coil.

10. The packaged IC device of claim 8, wherein the first inductor coil includes an outer coil surrounding and connected to a smaller nested coil, wherein the outer coils of the first and second inductor coils are aligned with each other to transfer power and the smaller nested coils of the first and second inductor coils are aligned with each other to transfer power.

11. The packaged IC device of claim 6, wherein the second IC die is devoid of an inductive coil which transfers power with either the first or the second inductor coils.

12. The packaged IC device of claim 11, wherein the first IC die is devoid of an inductive coil which transfers power with either the first or the second inductor coils.

13. A packaged integrated circuit (IC) device comprising:
a first IC die;
a first layer of adhesive on a first major surface of the first IC die;
an isolation layer over the first layer of adhesive, the isolation layer having a first major surface and a second major surface, wherein the second major surface of the isolation layer is between the first layer of adhesive and the first major surface;
a first inductor coil on the first major surface of the isolation layer;
a second layer of adhesive on the isolation layer;
a second IC die on the second layer of adhesive;
a lead frame flag, wherein the first IC die is attached to the lead frame flag;
wire bonds between the first IC die and a first set of lead fingers;
wire bonds between the second IC die and a second set of lead fingers; and
wire bonds between the second IC die and the isolation layer.

14. A packaged integrated circuit (IC) device comprising:
a first IC die;
a first layer of adhesive on a first major surface of the first IC die;
an isolation layer over the first layer of adhesive, the isolation layer having a first major surface and a second major surface, wherein the second major surface of the isolation layer is between the first layer of adhesive and the first major surface;
a first inductor coil on the first major surface of the isolation layer;
a second layer of adhesive on the isolation layer; and
a second IC die on the second layer of adhesive, wherein the second IC die is devoid of inductive coils which communicate with the first inductor coil.

* * * * *